US007949899B2

(12) United States Patent
Chen et al.

(10) Patent No.: US 7,949,899 B2
(45) Date of Patent: May 24, 2011

(54) CONTROL APPARATUS AND METHOD FOR CONTROLLING MEASURING DEVICES TO TEST ELECTRONIC APPARATUSES

(75) Inventors: Peng Chen, Shenzhen (CN); Yao Zhao, Shenzhen (CN); Hua-Dong Cheng, Shenzhen (CN); Wen-Chuan Lian, Taipei Hsien (TW); Han-Che Wang, Taipei Hsien (TW); Kuan-Hong Hsieh, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 202 days.

(21) Appl. No.: 12/174,635

(22) Filed: Jul. 17, 2008

(65) Prior Publication Data
US 2009/0049352 A1 Feb. 19, 2009

(30) Foreign Application Priority Data

Aug. 15, 2007 (CN) .......................... 2007 1 0075698

(51) Int. Cl.
*G06F 11/00* (2006.01)
(52) U.S. Cl. ........................... 714/25; 702/119; 702/123
(58) Field of Classification Search .................... 714/25, 714/27
See application file for complete search history.

(56) References Cited

U.S. PATENT DOCUMENTS

| 7,047,442 | B2 | 5/2006 | Sutton | |
|---|---|---|---|---|
| 7,237,159 | B2 | 6/2007 | Yatsuka | |
| 7,325,170 | B2 * | 1/2008 | Srinivasan et al. | 714/46 |
| 2003/0093718 | A1 * | 5/2003 | Sutton | 714/38 |
| 2005/0086561 | A1 * | 4/2005 | Huang | 714/25 |
| 2006/0136579 | A1 | 6/2006 | Linville et al. | |
| 2006/0136785 | A1 * | 6/2006 | Shu et al. | 714/38 |
| 2006/0242504 | A1 * | 10/2006 | Kadota | 714/725 |

FOREIGN PATENT DOCUMENTS

| CN | 1959710 | 5/2007 |
|---|---|---|
| CN | 1328663 | 7/2007 |

* cited by examiner

*Primary Examiner* — Yolanda L Wilson
(74) *Attorney, Agent, or Firm* — Zhigang Ma

(57) ABSTRACT

An electronic apparatus testing method is provided. The method includes the step of: reading a product ID of the electronic apparatus when the electronic apparatus is connected to a control apparatus; determining the device type ID from the product ID, wherein the product ID comprises basic information of the electronic apparatus, determining the script files of the functions of the electronic apparatus in the testing table according to the device type ID; obtaining the script files from a data storage and running the script files to test functions of the electronic apparatuses, sending a control instruction to the corresponding measuring device of the function to control the measuring device test the function during the process of running the script files; and displaying test results through a display of the control apparatus.

5 Claims, 3 Drawing Sheets

CONTROL APPARATUS AND METHOD FOR CONTROLLING MEASURING DEVICES TO TEST ELECTRONIC APPARATUSES

BACKGROUND

1. Field of the Invention

The present invention relates to control apparatuses and methods, and particularly to a control apparatus and method for controlling measuring devices in the testing of electronic apparatuses.

2. Description of Related Art

After manufacturing, electronic apparatuses need to be tested for performance. Generally, many functions of the electronic apparatuses need to be tested, such as the display, keyboard, or speakers. Each of the functions tested needs a corresponding testing apparatus. Additionally, because different electronic apparatuses have different functions, the manufacturer needs various and numerous kinds of measuring devices, which is expensive. Additionally, it is time consuming to change out the test device or move the apparatus to the next testing station after each test.

Therefore, what is needed is a test control apparatus and method which can test different functions of different electronic apparatuses, cheaply and efficiently.

SUMMARY

A control apparatus for controlling measuring devices to test electronic apparatuses is provided. The electronic apparatuses being connected to the control apparatus through universal serial buses (USB) of the control apparatus, the control apparatus includes a data storage, a plurality of measuring device interfaces, a device type ID determining module, a testing module, and a test result display module. The data storage is for storing a function table and a plurality of script files which are used for testing different functions of the electronic apparatuses, wherein the testing table is configured for recording relationship between the functions and the script files, the testing table comprises a column for recording a device type ID of the electronic apparatus, and the device type ID represents a category of each electronic apparatus and is associated with one or more functions. Each of the measuring device interfaces connects with one of the measuring devices. The device type ID determining module is for reading a product ID of each electronic apparatus when the electronic apparatuses are connected to the control apparatus, and determining the device type ID from the product ID, The script file determining module is for determining the script files of the functions of the electronic apparatus in the testing table. The testing module is for obtaining the script files from the data storage and running the script files to test the functions of the electronic apparatuses, and sending a control instruction to the corresponding measuring device of the function to control the measuring device to test the associated function of the corresponding electronic apparatus during the process of running the script files. The test result display module is for displaying test results on a display of the control apparatus.

Other advantages and novel features will be drawn from the following detailed description of the preferred embodiment with reference to the attached drawings.

BRIEF DESCRIPTION OF THE DRAWINGS

The components of the drawings are not necessarily drawn to scale, the emphasis instead being placed upon clearly illustrating the principles of the control apparatus. Moreover, in the drawings, like reference numerals designate corresponding parts throughout the several views.

DETAILED DESCRIPTION OF THE EMBODIMENTS

Figure 1:
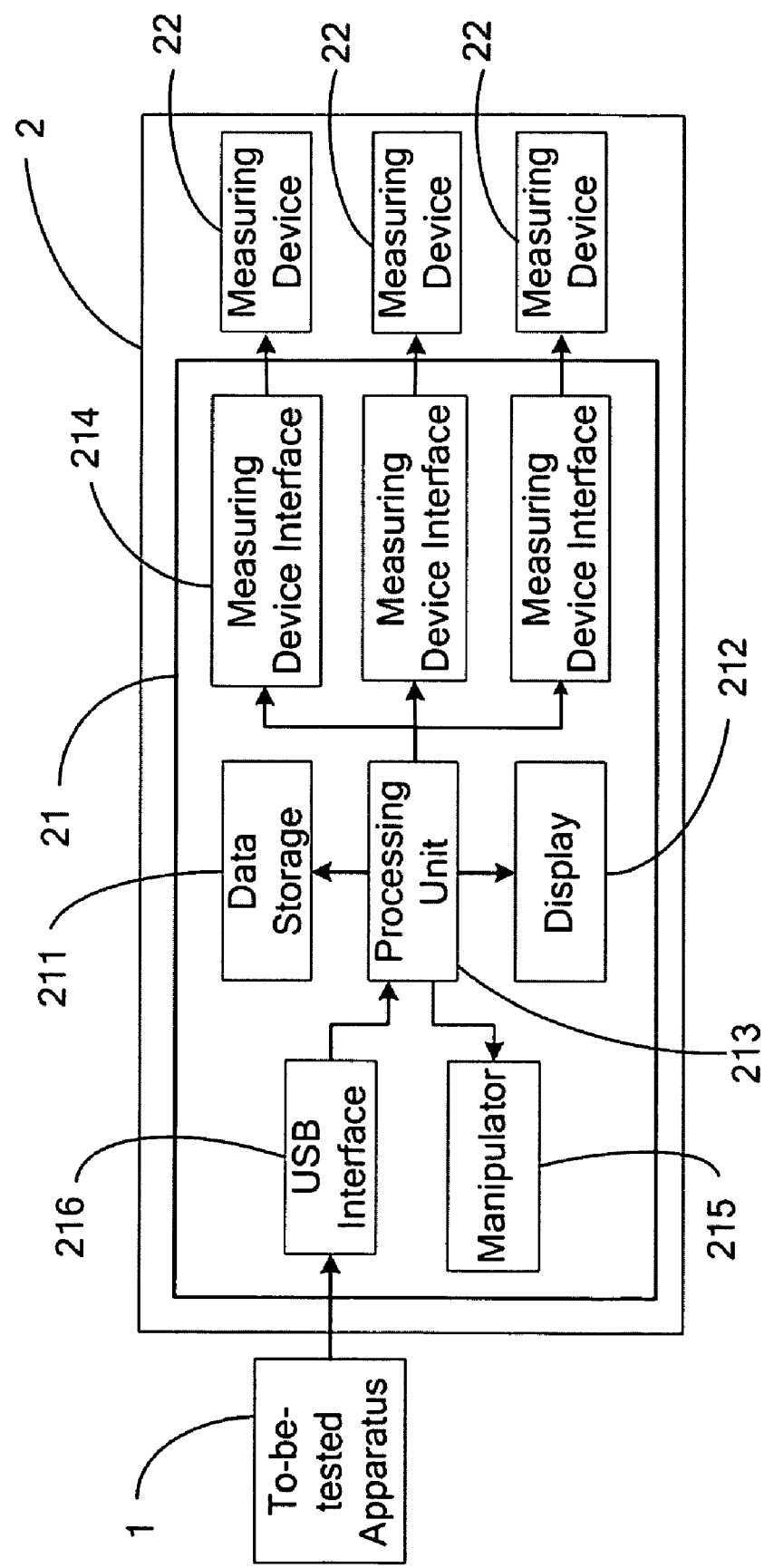
FIG. 1 is an exemplary hardware infrastructure diagram of an electronic apparatus testing system in accordance with a preferred embodiment of the present invention.

FIG. 1 is an exemplary hardware infrastructure diagram of an electronic apparatus testing system (hereinafter "the system") in accordance with a exemplary embodiment of the present invention. The system 2 includes a control apparatus 21 and a plurality of measuring devices 22. The control apparatus 21 includes a plurality of measuring device interfaces 214. Each of the measuring devices 22 is connected to the control apparatus 21 via the measuring device interface 214. Each of the measuring devices 22 is configured for testing a to-be-tested apparatus 1 according to control instructions transmitted from the control apparatus 21. The to-be-tested apparatus 1, e.g. a mobile phone or a media player, is connected to the control apparatus 21 through a universal serial bus (USB) interface 216. In this embodiment, the system 2 is operable to perform an acceptance test on components of the to-be-tested apparatus 1, such as a display screen, a keyboard, and a speaker. Each of the acceptance tests consists of a plurality of functions. The measuring devices 22 can be changed according to the functions to be performed.

The control apparatus 21 includes a data storage 211, a display 212, a processing unit 213, and a manipulator 215. The data storage 211 stores a testing table and script files. The script files are for performing a test according to the function to be tested. Each of the functions is associated with a script file. The testing table is configured for recording relationships between the functions and the script files.

The testing table includes a device type ID column, a function column, and a script ID column. Each entry under the device type ID column records a device type ID of the to-be-tested apparatus 1, such as ID1, ID2, and ID3. The to-be-tested apparatus 1 has an exclusive product ID. The product ID contains basic information of the to-be-tested apparatus 1, such as a brand, a type, and a serial number. In this preferred embodiment, the brand and the type of the to-be-tested apparatus 1 forms the device type ID. However, it should be noted that the base information of the device type ID is not limited to that described above. Each entry under the function column corresponds to one function to be performed. In this embodiment, because the system 2 is configured to perform a plurality of functions on the to-be-tested apparatus 1, each device type ID maps to a plurality of the functions. Each entry under the script ID column records script IDs of script files corresponding to the functions.

| Testing table | | |
|---|---|---|
| Device Type ID | Function | Script ID |
| ID1 | Display Screen | J1 |
|  | Keyboard | J2 |
|  | Speaker | J3 |

-continued

Testing table

| Device Type ID | Function | Script ID |
|---|---|---|
| ID2 | Keyboard | J2 |
|  | Camera | J4 |
|  | Size | J5 |
| ID3 | Display Screen | J7 |
|  | Camera | J8 |
|  | Speaker | J9 |

Actually, some functions of the different to-be-tested apparatuses 1 can be the same, for example, a mobile phone and a media player may have a same speaker functionality. Thus, the same script file can be used to test different to-be-tested apparatuses 1. For example, as that shown in the testing table, the script file with the script ID J2 can be used to test the function of a "keyboard" associated with the different device type IDs (ID1 and ID2).

Figure 2:
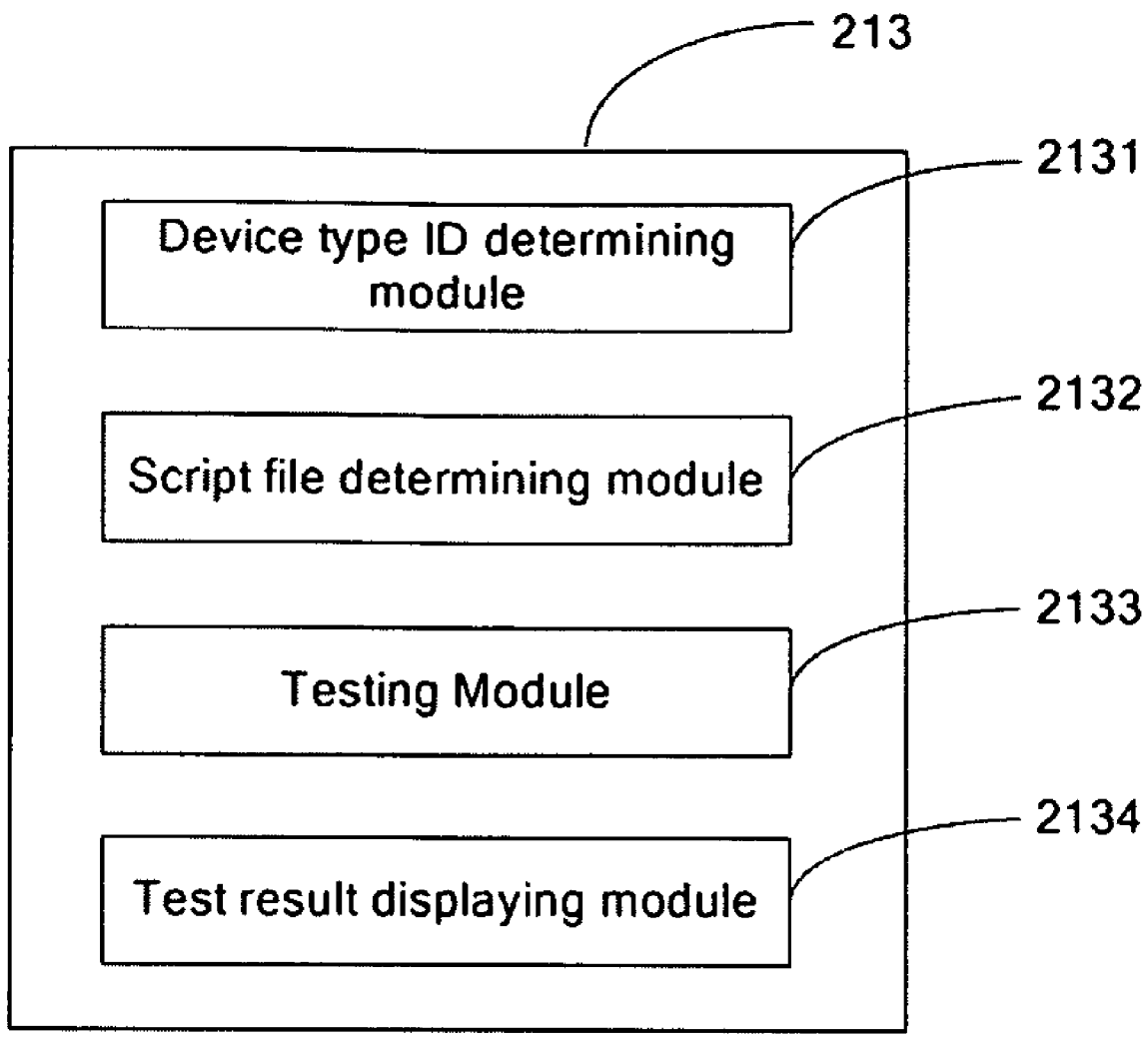
FIG. 2 is a diagram of main function modules implemented by a processing unit of a control apparatus of FIG. 1.

FIG. 2 is a diagram of the main function modules implemented by the processing unit 213. The processing unit 213 includes a device type ID determining module 2131, a script file determining module 2132, a testing module 2133, and a test result displaying module 2134. The device type ID determining module 2131 is for reading the product ID of the to-be-tested apparatus 1 when the to-be-tested apparatus 1 is connected to the control apparatus 21, and parsing the device type ID from the product ID. The script file determining module 2132 is for comparing the device type ID of the to-be-tested apparatus 1 with the device type IDs of the testing table. When the device type ID is matched, the script file determining module 2132 reads a first function from the function column which corresponds to the matched device type ID. The script file determining module 2132 obtains the corresponding script file ID from the script file ID column of the testing table. The testing module 2133 is for reading the script file from the data storage 211 according to the script file ID and running the script file to perform the test according to the first function to be performed on the to-be tested apparatus 1. After finishing the test according to the first function, the script file determining module 2132 obtains a second function to perform a second function on the to-be tested apparatus 1 until all the functions associated with the matched device type ID are completed.

The process of running the script file to perform the function is described below. Firstly, the testing module 2133 sends a move instruction to the manipulator 215. The manipulator 215 moves the to-be-tested apparatus 1 to a location according to the move instruction. The testing module 2133 sends a control instruction to the measuring device 22, and the measuring device 22 performs the function on the to-be-tested apparatus 1 according to the control instruction. After performing the function, the test results are stored in the data storage 211. The test result display module 2134 then displays the test results to the user on the display 212.

Figure 3:
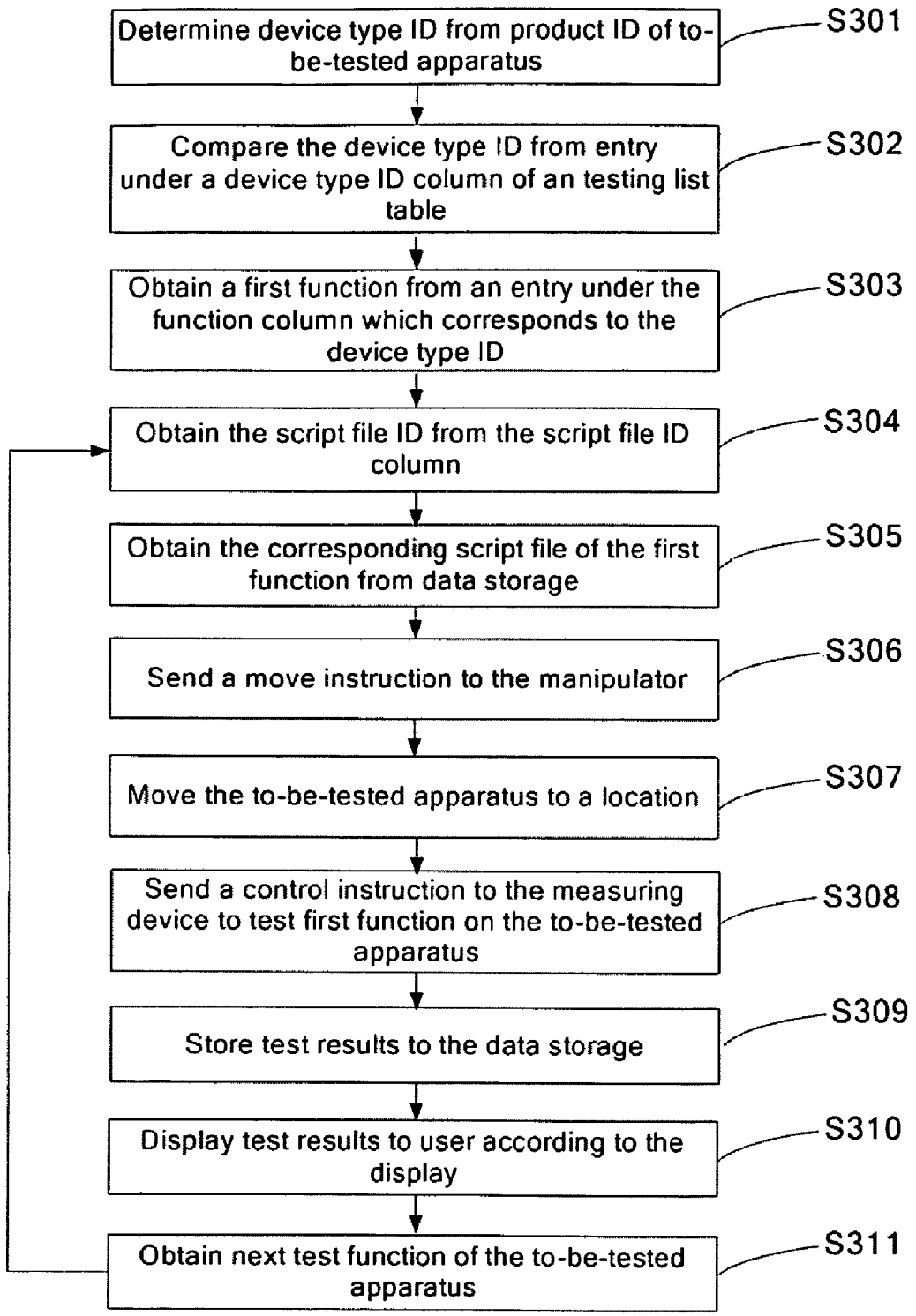
FIG. 3 is a flow chart for testing apparatuses utilizing the system.

FIG. 3 is a flow chart for testing the to-be-tested apparatus 1 utilizing the system 2. In step S301, the device type ID determining module 2131 reads the product ID of the to-be-tested apparatus 1 and parses the device type ID from the product ID.

In step S302, the script file determining module 2132 compares the device type ID of the to-be-tested apparatus 1 with the device type ID column of the testing table.

In step S303, the script file determining module 2132 reads the first function from the function column which corresponds to the matched device type ID.

In step S304, the script file determining module 2132 obtains the corresponding script file ID from the script file ID column of the testing table.

In step S305, the testing module 2133 reads the script file from the data storage 211 according to the script file ID and runs the script file to perform the function to be performed on the to-be tested apparatus 1

In step S306, the testing module 2133 sends a move instruction to the manipulator 215.

In step S307, the manipulator 215 moves the to-be-tested apparatus 1 to a location according to the move instruction.

In step S308, the testing module 2133 sends a control instruction to the measuring device 22, and the measuring device 22 performs the function on the to-be-tested apparatus 1 according to the control instruction.

In step S309, the test results are stored in the data storage 211.

In step S310, the test result display module 2134 displays the test results to the user via the display 212.

In step S311, the script file determining module 2132 reads the next function from the function column associated with the device type ID, and the process goes to the step S304 described above.

Although the present invention has been specifically described on the basis of a preferred embodiment, the invention is not to be construed as being limited thereto. Various changes or modifications may be made to the embodiment without departing from the scope and spirit of the invention.

What is claimed is:

1. A control apparatus for controlling measuring devices to test an electronic apparatus, the electronic apparatus connecting with the control apparatus via universal serial bus (USB) interfaces of the control apparatus, the control apparatus comprising:
    a data storage for storing a testing table and a plurality of script files which are used for testing different functions of the electronic apparatus, wherein the testing table is configured for recording relationship between the functions and the script files, the testing table comprises a column for recording at least one device type ID, and the at least one device type ID represents one electronic apparatus and is associated with one or more functions;
    a plurality of measuring device interfaces, each of which connects with one of the measuring devices;
    a device type ID determining module for reading a product ID of the electronic apparatus when the electronic apparatus is connected to the control apparatus, and determining the device type ID from the product ID, wherein the product ID comprises basic information of the electronic apparatus;
    a script file determining module for determining the script files of the functions of the electronic apparatus in the testing table according to the device type ID;
    a testing module for obtaining the script files from the data storage and running the script files to test the functions to be performed on the electronic apparatus, and sending a control instruction to the corresponding measuring device of the function to control the measuring device test the function during the process of running the script files; and
    a test result display module for displaying test results via a display of the control apparatus.

2. The apparatus as described in claim 1, wherein the basic information comprises a brand and a type of the electronic apparatus, and the codes of the brand and the type combine the device type ID.

3. The apparatus as described in claim 1, wherein the testing module further generates a move instruction for moving the electronic apparatus to a location before sending the control instruction to the corresponding measuring device of the function.

4. An electronic apparatus testing method comprising:

providing a data storage for storing a testing table and a plurality of script files which are used for testing different functions of the electronic apparatus, wherein the testing table is configured for recording relationship between the functions and the script files, the testing table comprises a column for recording at least one device type ID of the electronic apparatus, and the at least one device type ID represents one electronic apparatus and associates with one or more functions;

reading a product ID of the electronic apparatus when the electronic apparatus is connected to the control apparatus;

parsing the device type ID from the product ID, wherein the product ID comprises basic information of the electronic apparatus, and;

determining the script files of the functions of the electronic apparatus in the testing table according to the device type ID;

reading the script files from the data storage and running the script files to test the functions performed on the electronic apparatus;

sending a control instruction to the corresponding measuring device of the function to control the measuring device test the function during the process of running the script files; and displaying test results via a display of the control apparatus.

5. The method as described in claim 4, further comprising moving the electronic apparatus to a location before sending the control instruction to the measuring device to test the function.

* * * * *